(12) United States Patent
Nakayama et al.

(10) Patent No.: US 6,366,631 B1
(45) Date of Patent: Apr. 2, 2002

(54) JITTER MEASURING METHOD UTILIZING A/D CONVERSION AND DEVICE

(75) Inventors: Akihito Nakayama; Kenji Shintani, both of Singapore (SG); Shunsuke Kohama, Chiba; Yukari Hashimoto, Yokohama, both of (JP)

(73) Assignees: Sony Precision Engineering Center(s) Pte. Ltd., Singapore (SG); Disk Ware Co. Ltd., Tokyo (JP)

( * ) Notice: Subject to any disclaimer, the term of this patent is extended or adjusted under 35 U.S.C. 154(b) by 0 days.

(21) Appl. No.: 09/150,970

(22) Filed: Sep. 11, 1998

(30) Foreign Application Priority Data

Sep. 13, 1997 (SG) .......................................... 9703386-4

(51) Int. Cl.$^7$ ................................................ H04L 7/00
(52) U.S. Cl. ...................... 375/371; 375/238; 375/376; 327/100; 369/54
(58) Field of Search ................................. 375/371, 376, 375/258; 369/44.29, 44.27, 54, 59.24; 327/100

(56) References Cited

U.S. PATENT DOCUMENTS 5,828,636 A * 10/1998 Matsumoto et al. ..... 369/44.27
5,848,036 A * 12/1998 Ishibashi et al. ......... 369/44.29
5,978,335 A * 11/1999 Clark et al. .................... 369/54
6,100,724 A * 8/2000 Yoshimura et al. ......... 327/100

* cited by examiner

Primary Examiner—Stephen Chin
Assistant Examiner—Shuwang Liu
(74) Attorney, Agent, or Firm—Frommer Lawrence & Haug LLP; William F. Frommer; Darren M. Simon

(57) ABSTRACT

A jitter measurement device for reproducing a signal from an optical disc, which has simple circuit configuration and can effectively measure the jitter component. A matrix circuit 4 supplies the RF signals to the analog/digital converting circuit 6. Second, the computer 8 computes the slice level from the digitized data of the RF signals. Computer 8 computes the time point at which the RF signals become the indicated slice level, by interpolating, based on the digital data at the sampling point in the neighborhood of the said slice level, and the sampling frequency of the analog/digital converting circuit 6. A computer 8 computes each time breadth between the time points at which the RF signals become the slice level, then computes the jitter component of the reproduced signal, based on the each time breadth.

12 Claims, 9 Drawing Sheets

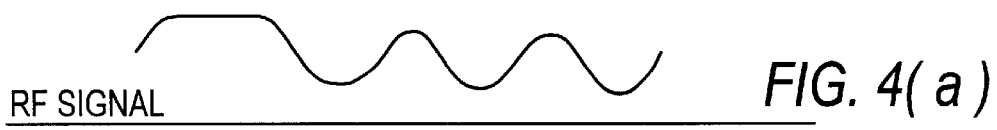
FIG. 4(a) RF SIGNAL
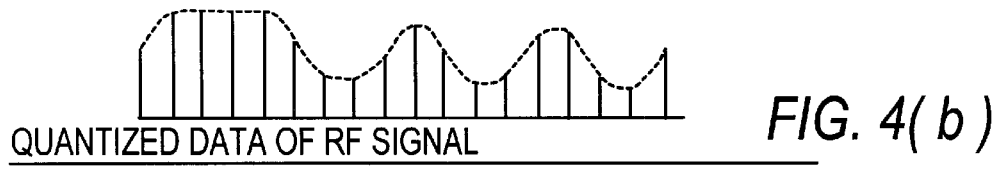
FIG. 4(b) QUANTIZED DATA OF RF SIGNAL
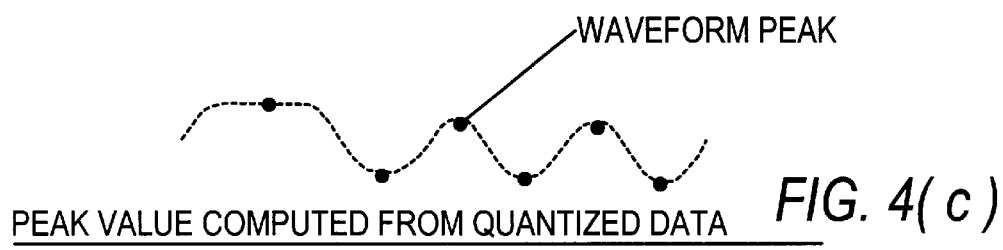
FIG. 4(c) PEAK VALUE COMPUTED FROM QUANTIZED DATA
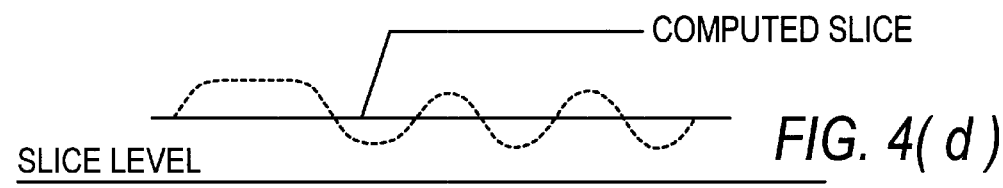
FIG. 4(d) SLICE LEVEL
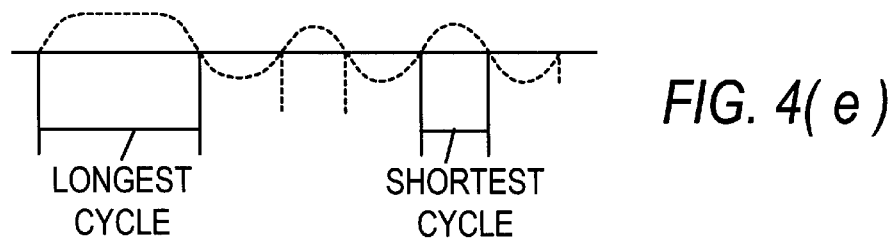
FIG. 4(e)
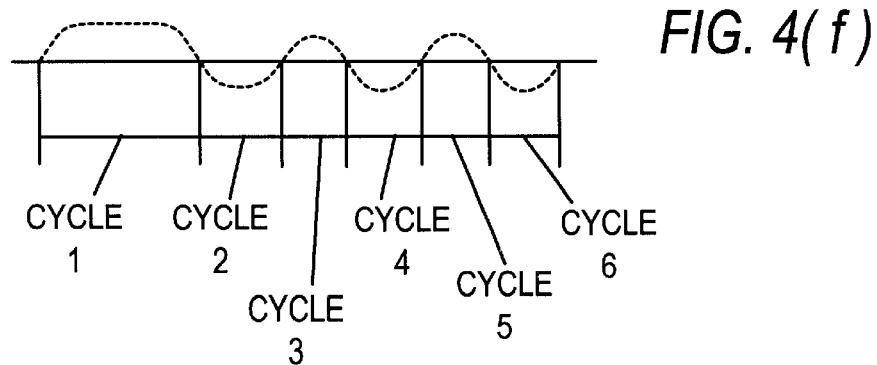
FIG. 4(f)

US 6,366,631 B1

JITTER MEASURING METHOD UTILIZING A/D CONVERSION AND DEVICE

FIELD OF THE INVENTION

The present invention relates to a jitter measurement device for signals reproduced from an optical disc, which measures the jitter component of the reproduced signal of optical disc by storing digital data in accordance with an indicated modulation rule; and jitter measurement method for reproduced signal of optical disc. In addition, this invention relates to a method and device for optical disc recording and/or reproducing.

BACKGROUND

The optical disc drive which reproduces the optical disc, in which the digital data is stored, detects reforming (RF) signals, and binarizes this RF signals, then generates the digital data. Specifically, the optical disc drive binarizes the RF signals, as shown in FIG. 7 (a), at the indicated slice level, and generates the digital data as shown in FIG. 7 (b).

Furthermore, the digital data which has been modulated according to the indicated modulation method, is generally recorded in the optical disc. For examples, for so-called compact disk, provided that one cycle of digital data is T, a signal to be recorded will be modulated from a signal with the cycle of 3T to that with 11T, and the waveform of each cycle will be randomly recorded. As another example, for digital video disc, provided that one cycle of digital data is T, a signal to be recorded will be modulated from a signal with the cycle of 3T to that with 14T, and the waveform of each cycle will be randomly recorded. The optical disc drive in which the digital data which has been modulated according to the indicated modulation method, is generally recorded, reproduces a signal from the optical drive; then it binarizes this signal, and generates digital data.

By the way, the digital data which has been binarized by the optical disc drive, should be generally reproduced in the way that noise riding on cyclic direction; that is, in the way that jitter component is contained. For examples, in case of picking up only the waveform with cycle of 3T, out of the RF signals reproduced from the optical disc, the cycle of the waveform if this RF signal will be 3T±σ(σ: jitter component), in which the jitter component is contained, as against the theoretical cycle 3T.

As for the reasons why such binarized digital data is reproduced containing the jitter component, for examples, we can consider the influence of noise which is included in the recording signal of the optical disc, or the influence from the characteristic of the optical pickup which detects the signals recorded in the optical disc.

Currently, a jitter measurement device which detects the jitter component of digital data reproduced from optical disc is known. The said jitter measurement device measures the jitter component of the RF signals reproduced from the optical disc. It is used for obtaining the characteristic of the optical disc or the optical pickup.

In the following sections, we will explain the first to the third jitter measurement device, which has currently been used for measuring of the jitter component of the RF signals reproduced from optical disc.

One known jitter measurement device, which has currently been used for measuring of the jitter component, computes the time breadth of digital data as voltage value, by using integration circuit, and measures the jitter component.

FIG. 8 is a waveform diagram explaining the method of operation for the first jitter measurement device on an input RF signal. First, the input RF signal is binarized by thresholding at a slice level to generate digital data. The first jitter measurement device starts an integration circuit on the leading edge of a positive transition in the digital data. The integration circuit is stopped on the trailing edge and the voltage from the integration circuit is read out. The output voltage indicates the time breadth of the digital data.

Therefore, the said first jitter measurement device can detect the jitter value which has been converted into the voltage value (σV), by comparing the said output voltage from the integration circuit with the voltage value corresponding to the integrated cycle.e We would remind you that the said first jitter measurement device can only detect the jitter component corresponding to the waveform of cycle 1, among the waveforms of multiple cycles, which have been modulated and recorded in the optical disc, by using one(1) integration circuit; because the characteristic of the integration circuit is determined in accordance with time constant. Namely, if the optical disc to be reproduced is a compact disc, the said first jitter measurement device can only detect the jitter component of the waveform with cycle of 3T, by using one(1) integration circuit; but it cannot detect the jitter component of the waveform with the other cycles, for example, the waveform with cycle from 4T to 11T.

A second known jitter measurement device, which has currently been used for measuring of the jitter component, has adopted a device so-called "time interval analyser". It counts the time breadth of digital data by using a high-speed clock, and detects the jitter component by using the said count output. The second jitter measurement device, as shown in FIG. 9, binarizes the RF signals at the indicated slice level, and generates the digital data. Second, the said second jitter measurement device let the clock circuit operate, as well as starts counting the clock number which is the output from the said clock circuit, at the time point when the RF signal reaches to the slice level, that is, at the leading edge of the digital data. Third, the said second jitter measurement device let the clock circuit stop at the time point when the RF signal reaches to the next slice level, that is, at the trailing edge of the digital data. The count number at this point is considered to be the time breadth of digital data for the said second jitter measurement device.

Therefore, the said second jitter measurement device can detect the jitter value, by comparing the said count number of the counter with the count number at the indicated cycle.

The third known type of jitter measurement device, which has currently been used for measuring of the jitter component, has adopted the first jitter measurement device and the said second jitter measurement device.

First, the third jitter measurement device, as shown in FIG. 10, binarizes the RF signals at the indicated slice level, and generates the digital data. During this operation, in the third second jitter measurement device, the clock circuit continues generating clock at the indicated clock frequency. Second, the said third jitter measurement device lets the clock circuit operate, as well as counts the clock number which is the output from the said clock circuit, by using a counter, at the time point when the RF signal reaches to the slice level, that is, at the leading edge of the digital data. In addition, the said third jitter measurement device starts operating the integration circuit at the said leading edge of the digital data. Third, the said third jitter measurement device stop operating the integration circuit, at the timing of the clock which has been generated immediately after the leading edge of the digital data. Then, the said third jitter measurement device measures the output voltage $V_1$ of the integration circuit, and converts the said output voltage $V_1$ into the time breadth, which is to be the first time breadth $t^1$ of the digital data.

The third jitter measurement device once again starts operating the integration circuit at the timing of the clock immediately before the time point when the RF signal reaches to the next slice level, that is, at the timing of the clock immediately before the trailing edge of the digital data. Then, the said third jitter measurement device stops operating the integration circuit at the time point when the RF signal reaches to the next slice level, that is, at the trailing edge of the digital data.

The third jitter measurement device detects the count number if the counter at the trailing edge of the digital data. Based on this count number and the clock frequency stated in the above, the device computes the time breadth from the timing of the clock generated immediately before the leading edge of the digital data, to the timing of the clock generated immediately after the trailing edge of the digital data. This time breadth will be called the second time breadth $t_2$ of the digital data. Also, the said third jitter measurement device measures the output voltage $V_3$ of the integration circuit at the above point, and converts the said output voltage $V_3$ into the time breadth, which is to be the third time breadth $t_3$ of the digital data.

Therefore, the said third jitter measurement device can measure the time breadth of the digital data, by adding all of the said the first time breadth $t_1$, the second time breadth $t_2$, and the third time breadth $t_3$. Furthermore, the said third jitter measurement device can detect the jitter value, by comparing the time breadth of the digital data with the theoretical value.

However, the current first to third jitter measurement devices, which have been described in the previous sections, have had the following problems:

For the said first jitter measurement device, it has been likely to be affected by noise and difficult to measure the time breadth in stable condition, because it has used the integration circuit to measure the time breadth in analog. In addition, since the said first jitter measurement device cannot measure the waveform with more than one cycle by using one integration circuit, it has required the number of the integration circuits as many as the number of the waveform with cycles to be measured, if you want to measure the jitter component of the waveform with multiple cycles. Namely, for the said first jitter measurement device, for examples, you need nine(9) integration circuits with different time constants in order to detect every jitter component of the waveform with cycles from 3T to 11T, Which have been included in a compact disc. Therefore, the said first jitter measurement device has had complex hard configuration.

For the said second jitter measurement device, since it measures the time breadth by counting clock, it has not been able to measure the shorter time breadth than the said clock cycle. In addition, since the said second jitter measurement device has used the high-speed clock, its processing circuit has had to be complex. Therefore, it has been difficult to save its cost.

For the said third jitter measurement device, it has been likely to be affected by noise and difficult to measure the time breadth in stable condition, because it has used the integration circuit to measure the time breadth in analog. In addition, since the said third jitter measurement device should have a complex circuit configuration, its cost cannot be less expensive. Also, since the said third jitter measurement device has used the integration circuit, it has required the number of the integration circuits as many as the number of the waveform with cycles to be measured Therefore, the said third jitter measurement device has had to be complex in its hard configuration.

An object of the present invention is to overcome or substantially ameliorate at least some of the disadvantages of the prior art.

SUMMARY OF THE INVENTION

To attain the above-mentioned object, the invention provides a method of measuring jitter in pulse width modulated signals previously recorded on an optical disk in units of cycles and being reproduced therefrom. The method first detects a cyclic signal reproduced from the optical disk using an optical pickup. The cyclic signal is then sampled at a predetermined sampling interval so as to define sampling points, thereby producing sample data corresponding to the signal level of the cyclic signal at each of the sampling points. The method next computes a timebreadth corresponding to a time interval for which the signal level exceeds a slice level. The timebreadth is computed by first computing a first time point at which the signal level first exceeds the slice level, by interpolating between the sampling point first exceeding the slice level and the previous sampling point. Then a second time point, at which the signal level first drops below said slice level subsequent to said first time point, is computed by interpolating between the sampling point last exceeding the slice level and the next sampling point. A first time interval is then computed corresponding to the time between the first time point and the sampling point first exceeding the slice level. A second time interval is also computed corresponding to the time between the sampling point first exceeding the slice level and the sampling point last exceeding the slice level. A third time interval is computed corresponding to the time between the second time point and the sampling point last exceeding the slice level. The timebreadth is then computed by adding the first, second, and third time intervals. Finally, a jitter measurement is calculated based upon the difference between the computed timebreadth and a cyclic window corresponding to a theoretical timebreadth of the cyclic signal as recorded.

The method may further comprise detecting a peak level of the sampled cyclic signal and computing the slice level based upon the peak level. The peak level is based upon a maximum level and the absolute value of a minimum level of the sampled cyclic signal.

In a first embodiment of the invention, the peak level must exceed one fourth of the value of a theoretical signal level for the cyclic signal.

In another embodiment, the peak level must be sustained for a time interval greater than one half a minimum cyclic window corresponding to a minimum theoretical timebreadth of the cyclic signal as recorded.

The method may additionally compute an asymmetry value for the reproduced cyclic signal by detecting and comparing a peak value for each cycle of the cyclic signal.

A further aspect of the invention provides a device for measuring jitter in pulse width modulated signals previously recorded on an optical disk in units of cycles and being reproduced therefrom. The device has an optical pickup for detecting a cyclic signal reproduced from the optical disk.

An analog to digital converter is provided for sampling the cyclic signal at a predetermined sampling interval so as to define sampling points, thereby producing sample data corresponding to the signal level of the cyclic signal at each of the sampling points. The device also has an operation processing means for computing a timebreadth corresponding to a time interval for which the signal level exceeds a slice level. The timebreadth is computed by first computing a first time point at which the signal level first exceeds the slice level, by interpolating between the sampling point first exceeding the slice level and the previous sampling point. Next, a second time point is computed at which the signal level first drops below the slice level subsequent to the first time point, by interpolating between the sampling point last exceeding the slice level and the next sampling point. Further, a first time interval is computed corresponding to the time between the first time point and the sampling point first exceeding the slice level. A second time interval is next computed corresponding to the time between the sampling point first exceeding the slice level and the sampling point last exceeding the slice level. A third time interval is then computed corresponding to the time between the second time point and the sampling point last exceeding the slice level. Finally, the timebreadth is computed by adding the first, second, and third time intervals. The operation processing means then calculates a jitter measurement based upon the difference between the computed timebreadth and a cyclic window corresponding to a theoretical timebreadth of the cyclic signal as recorded.

The operation processing means of the device further detects a peak level of the sampled cyclic signal and computes said slice level based upon the peak level. The peak level is based upon a maximum level and the absolute value of a minimum level of the sampled cyclic signal.

In another embodiment of the invention, the peak level must exceed one fourth of the value of a theoretical signal level for the cyclic signal.

In still another embodiment, the peak level must be sustained for a time interval greater than one half a minimum cyclic window corresponding to a minimum theoretical timebreadth of the cyclic signal as recorded.

The device may additionally compute an asymmetry value for the reproduced cyclic signal by detecting and comparing a peak value for each cycle of the cyclic signal.

BRIEF DESCRIPTION OF THE DRAWINGS

In order that the invention might be more fully understood, embodiments of the invention will be described, by way of example only, with reference to the accompanying drawings, in which:

FIG. 4: Is a waveform diagram to explain the processing contents of the above measuring device for characteristic of optical pickup.

DETAILED DESCRIPTION OF EMBODIMENTS OF THE INVENTION

Figure 1:
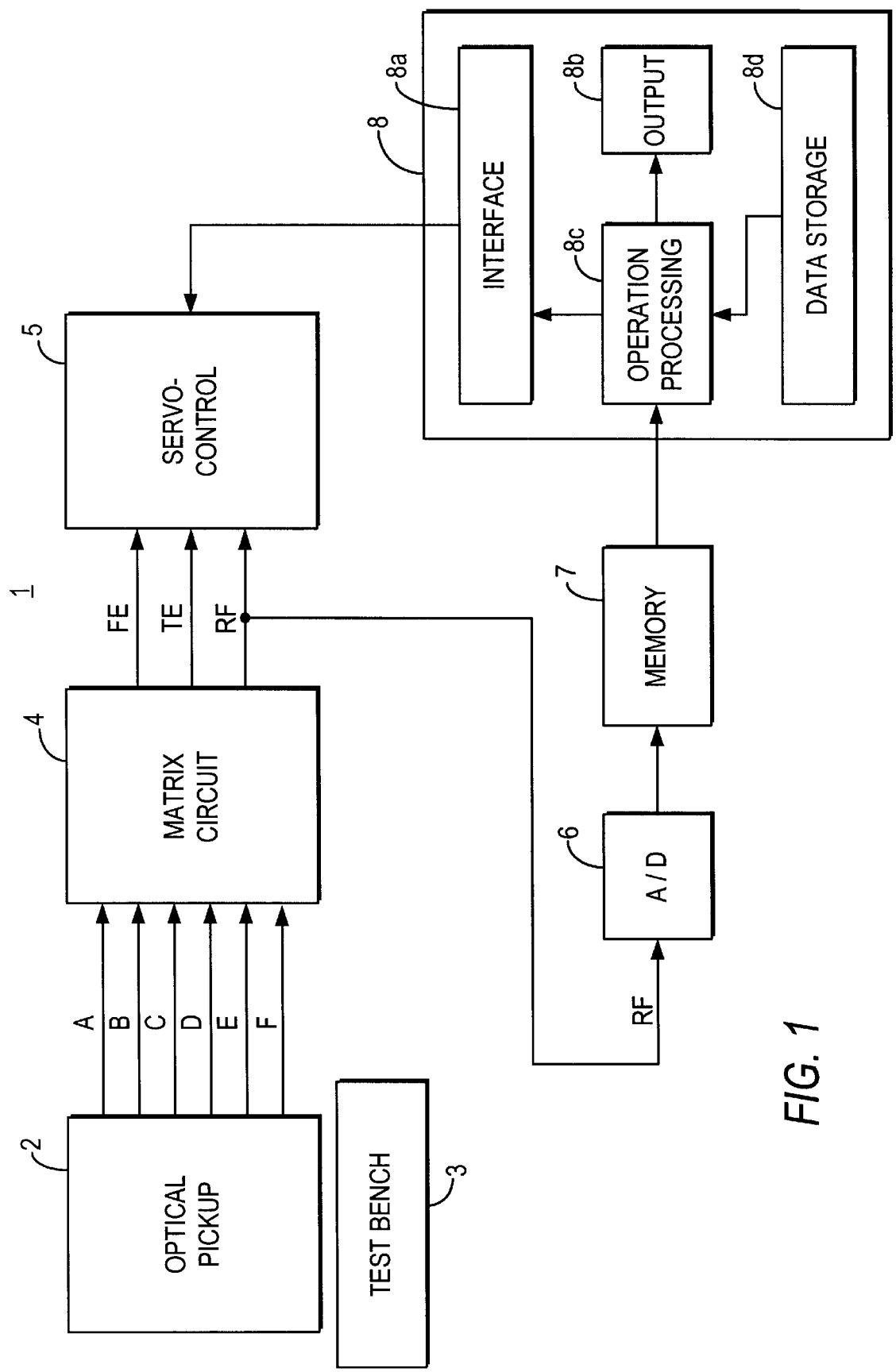
FIG. 1: Is a block diagram describing the application of an embodiment of the invention, the measuring device for characteristic of optical pickup.

Referring to the drawings, FIG. 1 shows a block configuration describing the application of an embodiment of the invention, the characteristic test device. The characteristic test device 1, as shown in the FIG. 1, has the following features: optical pickup 2, which will be a test object; test bench 3, where optical disc will be set; matrix circuit 4, to which the output from a photo detector possessed by optical pickup 2, will be provided, and which will output reforming (RF) signals; and servo control circuit 5, which will servo control for the reproducing drive of optical disc, based on the output from the matrix circuit 4. In addition, this characteristic test device 1 also has the following: the first analog/digital converting circuit 6, which will convert RF signals from the matrix circuit 4 into digital data; and the first memory 7, which temporarily stores the output from the first analog/digital converting circuit 6.

Moreover, this characteristic test device 1 has computer 8, which will process operation of the jitter component and display the result of the processing, based on the digital data temporarily stored in the memory 7, and will control the servo control circuit 5, based on the said result of the processing.

Optical pickup 2 is an inspection object for the characteristic test device 1. This optical pickup 2 can, for example, be freely attached to or removed from the characteristic test device 1. The optical pickup 2 also has laser diode, beam splitter, object lens, and photo detector, etc. Furthermore, the optical pickup 2 lets laser emitted from laser diode gather on the optical disc through beam splitter, object lens, etc. Then, the optical pickup 2 lets reflection light from an image on photo detector. The photo detector possessed by the optical pickup 2, is photoelectric conversion element; it converts the reflection light which has formed an image, into electric signals.

Figure 2:
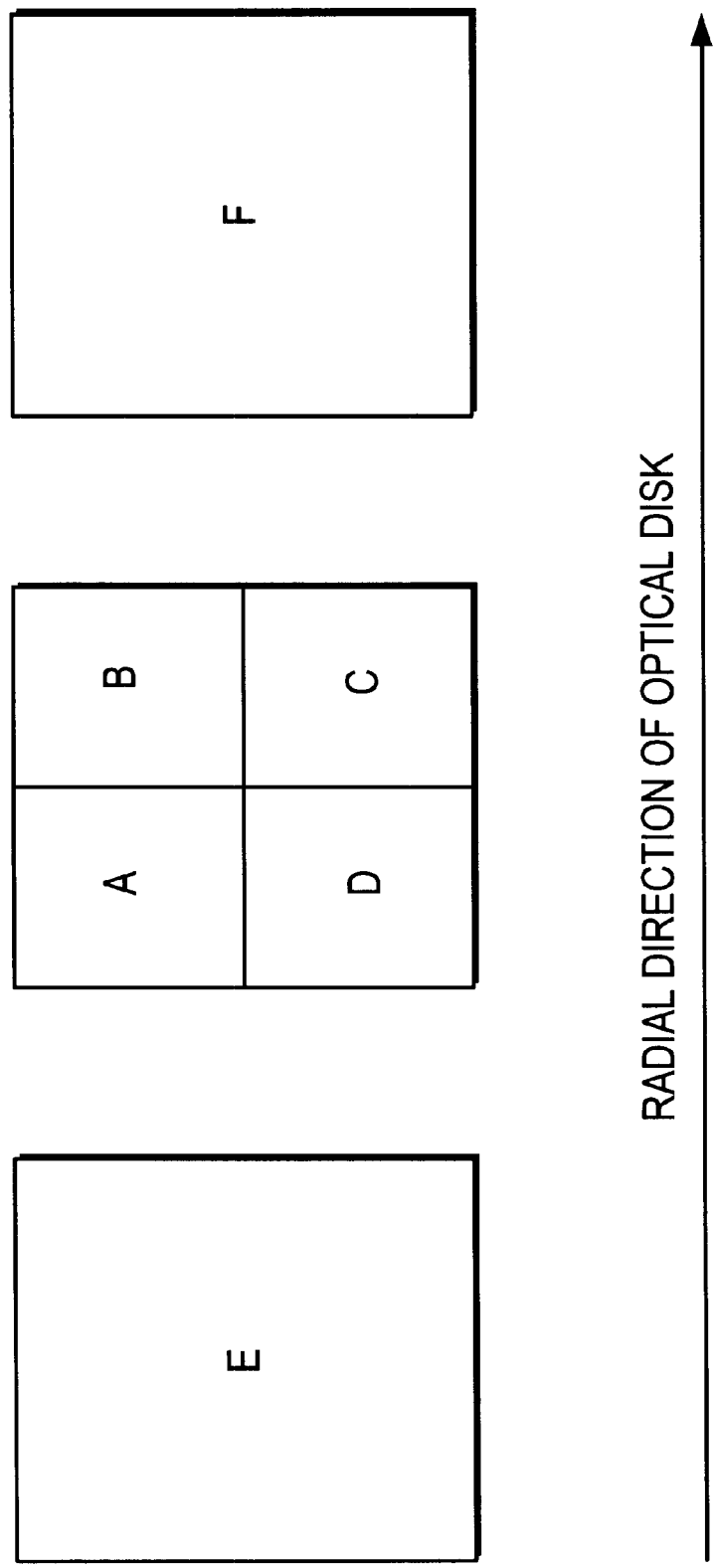
FIG. 2: Shows an example of the photo detector equipped with the optical pickup, which is a test object of the above measuring device for characteristic of optical pickup.

The optical pickup 2 has multiple photo detectors. FIG. 2 shows an example of multiple photo detectors which are equipped with the optical pickup 2. For example, as shown in FIG. 2, the optical pickup 2 has 4 photo detectors A to D which are arrayed in the shape of 2×2 matrix, and photo detectors E and F for side spot inspection at both sides of the photo detectors A to D which are arrayed in such a manner. Such photo detectors A to F are, for example, adopted in optical pickup with the so-called three-spot method, in which three shots of laser will be emitted to optical disc. Main beam, which will be a center light in the three-spot method, shall be irradiated to the photo detectors A to D. In other words, reflection light against memory bit recorded in the tracks of optical disc, shall be irradiated to the photo detectors A to D. The photo detectors E and F are radially installed at both sides of the photo detectors A to D. Side beam in the three-spot method shall be irradiated to the photo detectors E and F. For example, light reflected from an edge, for example, of tracks of the optical disc shall be irradiated to these photo detectors E and F.

The test bench 3, where optical disc will be set, rotates and drives the optical disc in order to reform the optical disc. In addition, the optical disc which will be set in the test bench 3, is used as a reference for the characteristic test device 1, namely, the characteristic test device 1 measures the characteristic of the optical pickup 2, based on the reproduced signal of the optical disc which is used as a reference for the characteristic test device 1.

The matrix circuit 4, to which the signals A to F, the output from each photo detector A to F possessed by the said optical pickup 2 will be supplied, and generates reforming (RF) signals, focus error (FE) signals, and tracking error (TE) signals, based on the signals A to F. For example, the matrix circuit 4, based on the signals A to F, generates RF signals, FE signals, and TE signals, as follows: the matrix circuit 4, based on the signals A to D, processes A+B+C+D, then generates RF signal; also, the matrix circuit 4, based on the signals A to D, processes (A+C)−(B+D), then outputs the processing result as FE signal: that is, the matrix circuit 4 outputs FE signal, based on the non-point aberration method; finally, the matrix circuit 4, based on the signals E and F, processes E−F, then outputs the processing result as TE signal.

Furthermore, the digital data which has been modulated according to the indicated modulation method, is recorded in the optical data. For examples, for so-called compact disk, provided that one cycle of digital data is T, a signal with the cycle of 3T to that with 11T will be randomly recorded. As another example, for digital video disc, provided that one cycle of digital data is T, a signal with the cycle of 3T to that with 14T will be randomly recorded. Such digital data, which has been modulated according to the indicated modulation method, is generated by binarizing the RF signals which the matrix circuit 4 has generated, at the indicated slice level.

The matrix circuit 4 supplies RF signals, FE signals, and TE signals, which have been processed in the above manner, to the servo control circuit 5. Also, the matrix circuit 4 supplies RF signals to the first analog/digital converting circuit 6.

The servo control circuit 5, servo-controls during reproducing drive of optical disc, based on RF signals, FE signals, and TE signal. Specifically, the servo control circuit 5, based on RF signals, drives a biaxial actuator, which operates the object lens of the optical pickup 2, until the FE signal reaches 0, and performs focus servo control. The servo control circuit 5, based on TE signals, drives a biaxial actuator, which operates the object lens of the optical pickup 2, until the TE signal reaches 0, and performs tracking servo control. The servo control circuit 5, detects DC component of FE signals, and performs thread servo control, until the DC component becomes 0. Also, the servo control circuit 5, based on RF signals, performs tilt servo control, which controls the inclination of optical disc. Further, it is also good for the servo control circuit 5 to perform tilt servo control, with installing separate structure for detecting the inclination of optical disc.

The analog/digital converting circuit 6 samples the RF signals at a sampling frequency, which is high-speed properly enough to remember the waveform of minimum theoretical frequency for the digital data in accordance with the indicated modulation method, which is generated from the RF signals, for examples, the waveform with frequency 3T for a compact disc.

The analog/digital converting circuit 6 converts RF signal into digital data, for example, at the sampling frequency of about 30 MHz. The analog/digital converting circuit 6 supplies the RF signal, which has been converted into digital data, to the memory 7.

The memory 7 temporarily stores the RF signal which has been converted into digital data by the analog/digital converting circuit 6.

Computer 8 has interface division 8a; data storage division 8b; output division 8c; and processing division 8d, etc. The interface division 8a outputs control signals, which is for controlling the servo control circuit 5, toward the servo control circuit 5. The data storage division 8b stores various processing programs which correspond to each measuring item of the optical pickup 2 in the characteristic test device 1. The output division 8c displays the results of measuring the characteristic of the optical pickup 2.

The processing division 8d of the computer 8, reads out the RF signals, which have been converted into digital data and stored in the first memory 7, then detects jitter component of the RF signals, based on the read-out data.

Furthermore, the processing division 8d of the computer 8 also performs the following processing on the data stored in the memory 7, when it processes according to each measuring item: For example, the processing division 8d performs filter operation; peak level operation; operation for computing waveform period; operation for computing phase difference between two signals; signal extract operation by level window; and signal extract operation by periodic window.

Next, we will explain their processing contents of measuring the jitter component items of the optical pickup 2 by using the said characteristic test device 1, as shown in FIG. 3, FIG. 4, FIG. 5, and FIG. 6.

Figure 3:
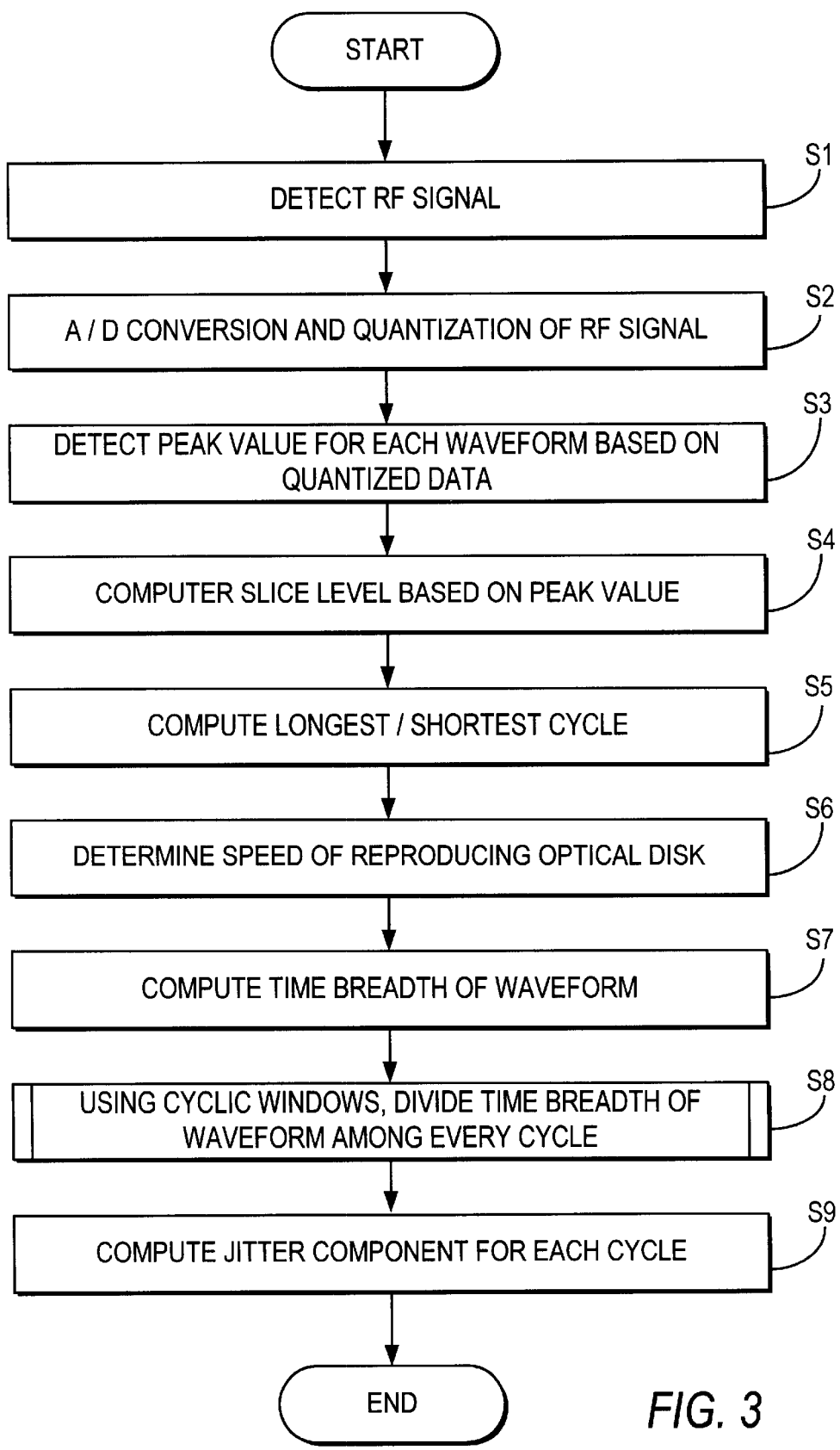
FIG. 3: Is a flow chart to explain the processing contents of the above measuring device for characteristic of optical pickup.

When the optical pickup 2 is set by a user and operation start is directed, the characteristic test device 1 begins processing from the step S1 in the flow chart, as shown in FIG. 3.

In the step S1, the characteristic test device 1 reproduces the optical disc and detects the RF signals which is shown in FIG. 4(a), for examples.

In the step S2, the characteristic test device 1 converts the RF signals into digital data through the analog/digital converting circuit 6, and quantizes them, as shown in FIG. 4(b). The said quantized RF signals will be stored in the memory 7 in sequence.

In the step S3, the characteristic test device 1 detects the peak value of each waveform of the RF signals as shown in FIG. 4(c), based on the quantized RF signals. Namely, in the RF signals which have been reproduced from the optical disc, for example, waveforms which have the component of the cycles of 3T to 11T, are randomly contained. Therefore, the RF signals becomes the waveform in which a level vertically fluctuates to plus and minus. The characteristic test device 1 detects the peak value of plus side and the peak value of minus side for each waveform, in the said fluctuation.

Moreover, for processing of measuring the peak value in the step S3, the processing division 8d reads out the quantized data, which has been stored in the memory 7. The same procedures will be taken in and after the following step S4.

Next, in step S4, the characteristic test device 1 computes the slice level during the RF signals are binarized, as shown in FIG. 4(d), based on the peak value of detected RF signals. In this procedure, the characteristic test device 1 computes the said slice level by performing the operation described as follows:

For examples, the characteristic test device 1 computes average value of the peak values at plus side and average value of the peak values at minus side for all waveforms, then determines the middle point of these average values to be a slice level. Alternatively, the characteristic test device 1 can determine the value, in which the indicates offset is added to the middle point, to be a slice level. Furthermore, the characteristic test device 1 can detect only the indicated waveform of the indicated cycle, which has been included in the RF signals, instead of the peak values of all waveforms: for example, it can detect only waveform of 3T, then determine the middle point of these average values of the peak values of 3T waveform, to be a slice level.

Moreover, in case of computing the said slice level, the characteristic test device 1 can use the peak value which has been detected by adding the indicated restriction, in order to eliminate noise component, etc.

For example, the characteristic test device 1 detects only the peak value with the level of ¼ or more as against the theoretical amplitude of the RF signals of the optical disc, which will be reproduced. By adding restriction toward the amplitude direction during detecting the peak value, the characteristic test device 1 can eliminate noise component, so that it is able to compute an accurate slice level. For another example, the characteristic test device 1 detects the peak value only when the time breadth between a peak value and another peak value is ½ or more of the cycle of the shortest cycle waveform (e.g. 3T) of the RF signals of the optical disc to be reproduced.

By adding restriction toward the time base direction during detecting the peak value, the characteristic test device 1 can eliminate noise component, so that it is able to compute an accurate slice level.

We would further mention that in case of setting a slice level for the characteristic test device 1, you can let user set the value randomly, or add offset to the slice level which has been computed by the above procedures: either case is acceptable.

In step S5, the characteristic test device 1 separates the RF signals into levels, using the computed slice level, then computes the cycle of each waveform which is delimited by the said slice level. The characteristic test device 1 computes such cycles, for example, based on the sampling frequency of the analog/digital converting circuit 6, which was discussed in the previous sections. Then, the characteristic test device 1 computes the longest cycle or the shortest cycle, based on the computed cycles of each waveform. If the optical disc to be reproduced is a compact disc, the shortest cycle will be 3T, or about 670 n seconds.

In step S6, the characteristic test device 1 computes at haw many times of the speed the characteristic test device 1 reproduces the optical disc, based on the computed longest cycle or the shortest cycle, as shown in FIG. 4(e). Namely, the characteristic test device 1 compares the computed longest cycle or the shortest cycle with the theoretical value cycle, and computes at haw many times of the speed, it currently reproduces the optical disc.

Please note that if at which speed the optical disc is currently reproduced has been known in advance, the characteristic test device 1 will not process the step S5 and the step S6, but go forth to process from the step S4 to the step S7.

In step S7, the characteristic test device 1 computes the time breadth of each waveform, as shown in FIG. 4(f).

Figure 5A:
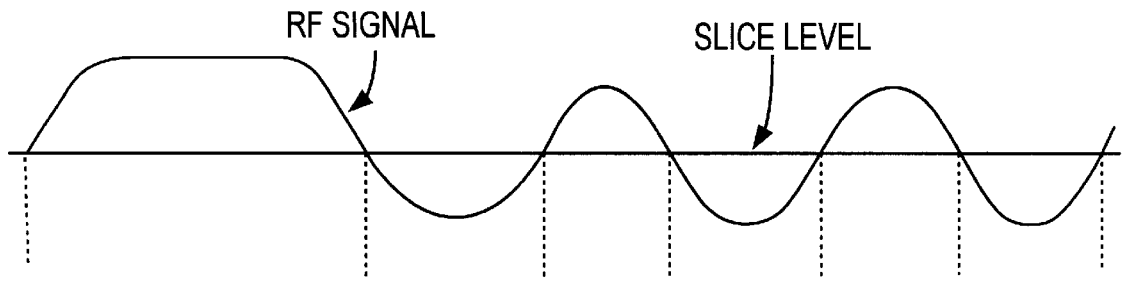
FIG. 5: Is a waveform diagram to explain the processing contents of the above measuring device for characteristic of optical pickup.
Figure 5B:
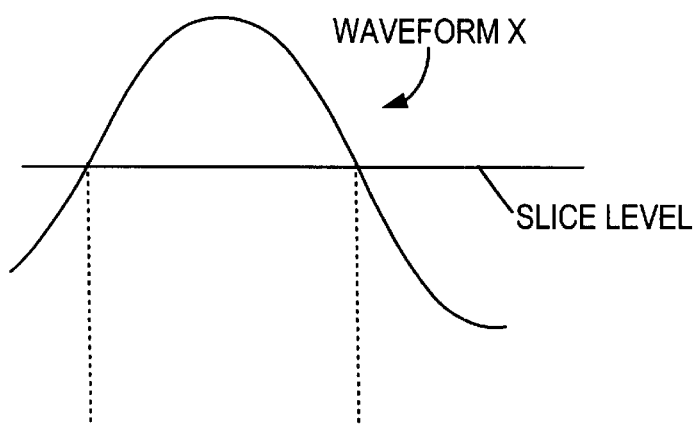

In the following sections, we will specifically describe step S7, using an example: in case of computing the time breadth of a part of waveform X, which is shown in FIG. 5(b), among the RF signals as shown in FIG. 5(a).

Figure 5C:
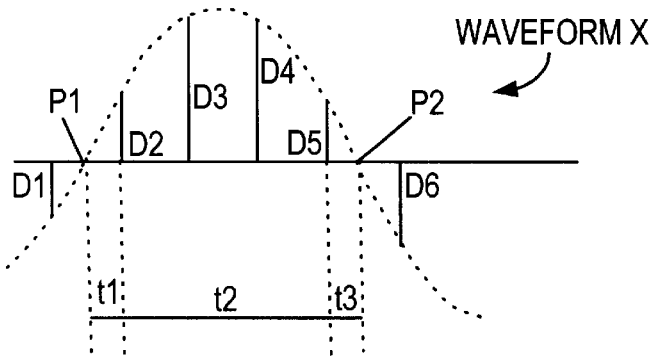
Figure 6:
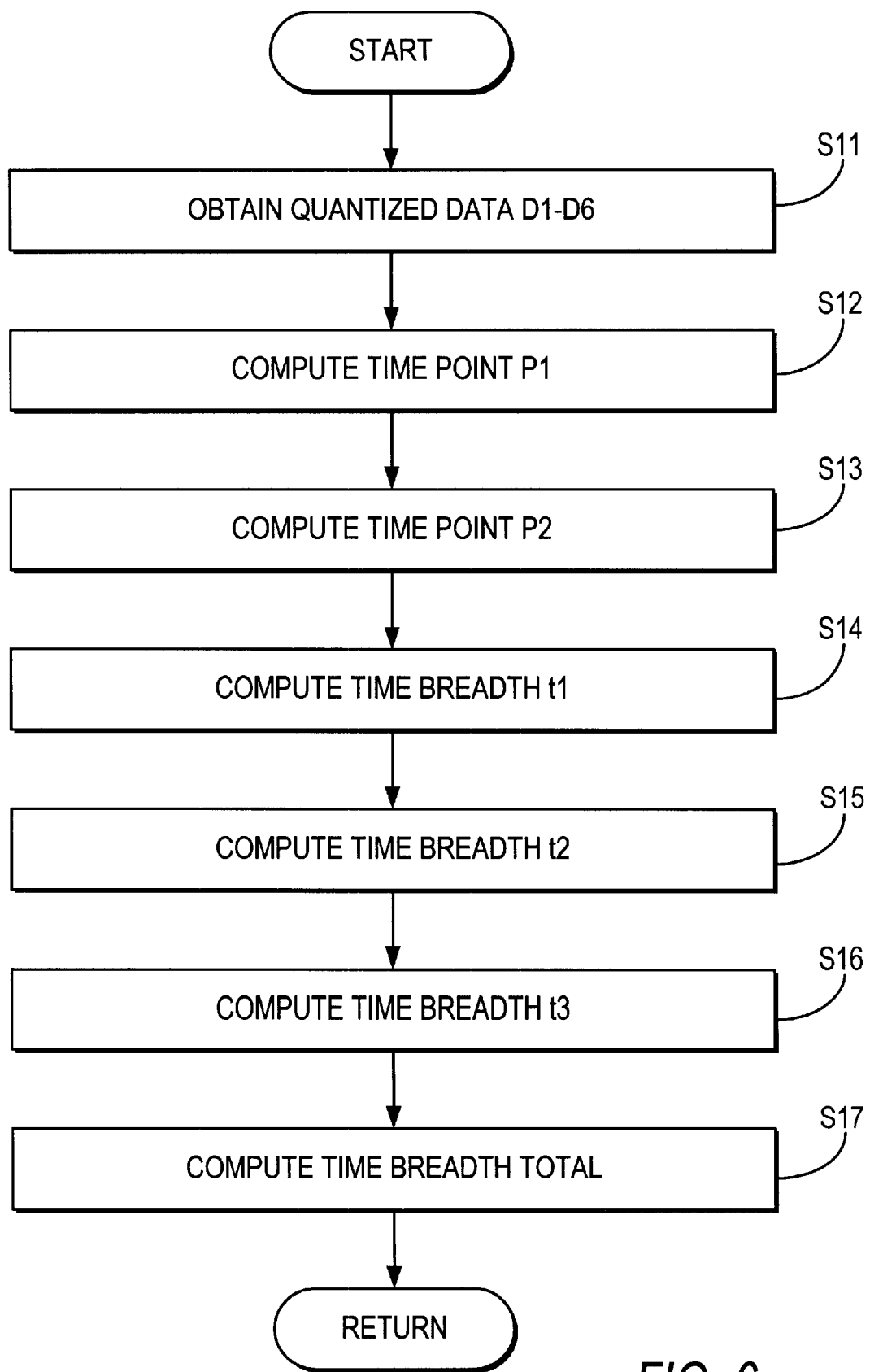
FIG. 6: Is a flow chart to explain the processing contents of the above measuring device for characteristic of optical pickup.
Figure 7:
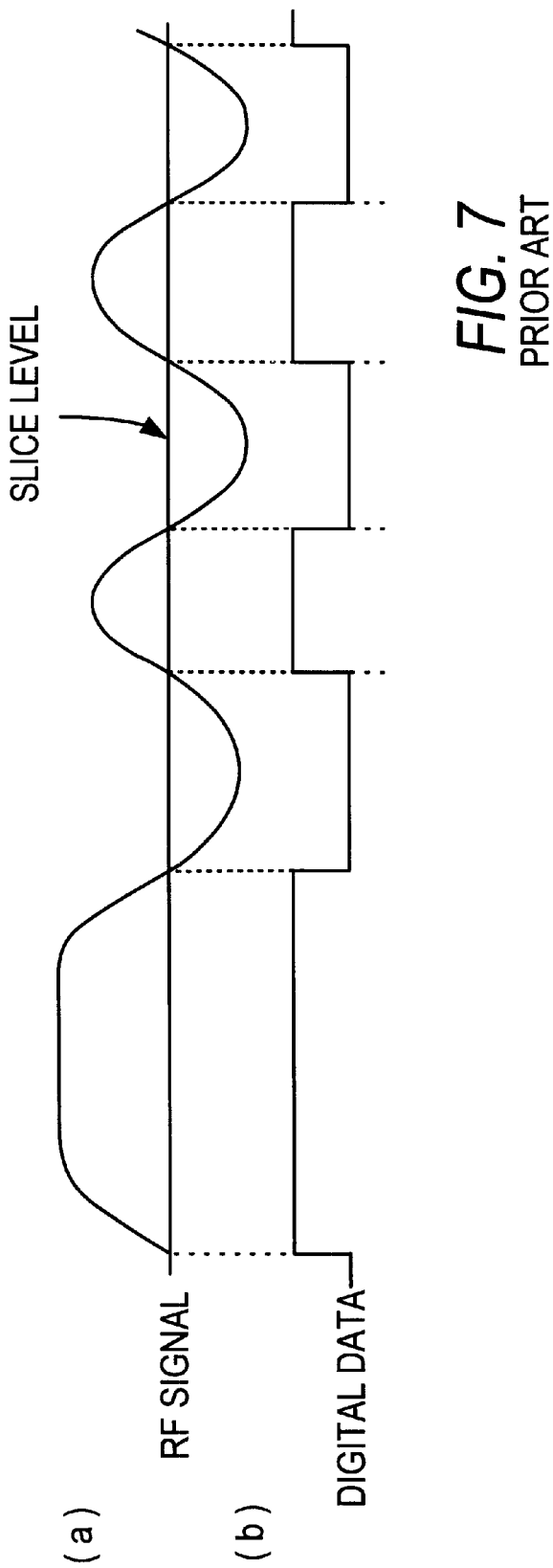
FIG. 7: Is a waveform diagram to explain the RF signals with a known binarized optical disc drive.
Figure 8:
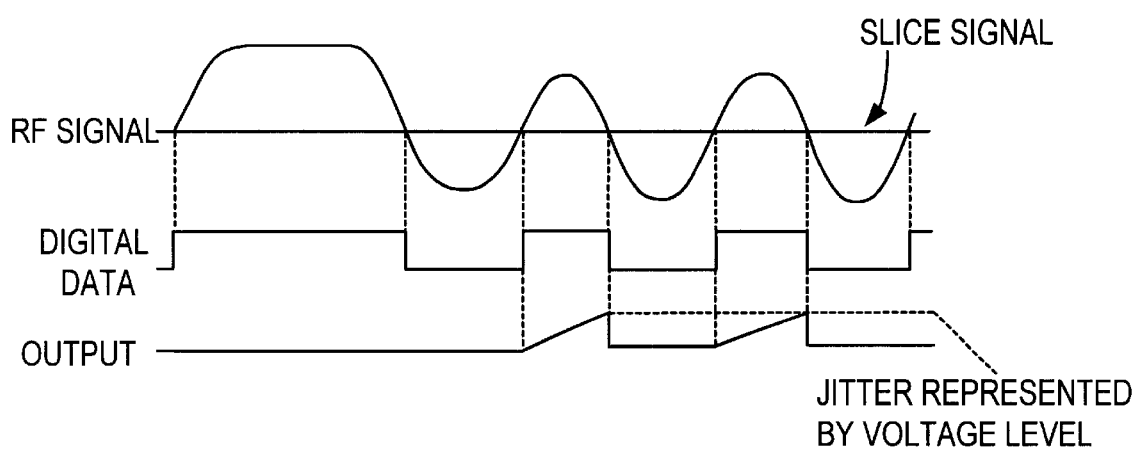
FIG. 8: Is a waveform diagram to explain the measurement method of the known jitter measurement device.
Figure 9:
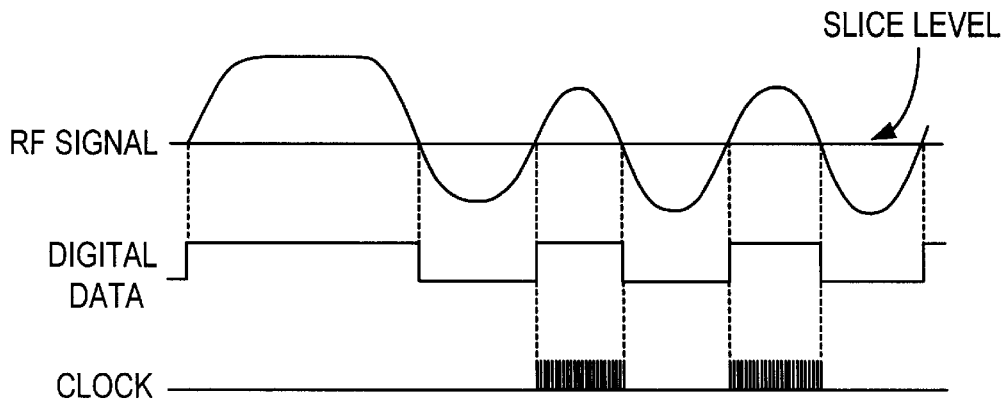
FIG. 9: Is a waveform diagram to explain the measurement method of the known jitter measurement device.
Figure 10:
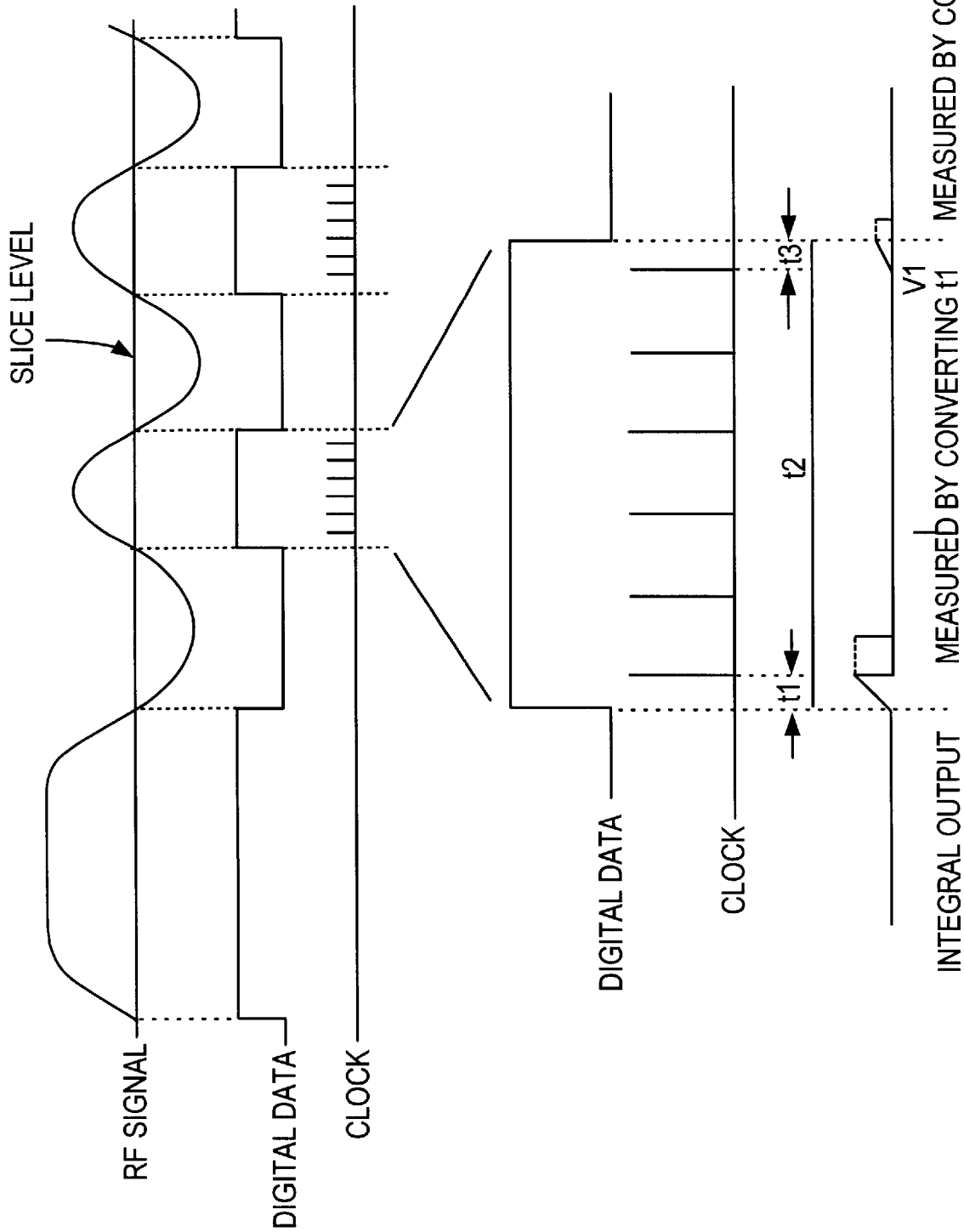
FIG. 10: Is a waveform diagram to explain the measurement method of the known jitter measurement device.

The characteristic test device 1 computes the time breadth of waveform X, which is shown in FIG. 5(b), by processing from step S11 to step S17, as shown in FIG. 6. First, in step S11, the characteristic test device 1 obtains the quantized data D1 to D6, for the said part of waveform X, as shown in FIG. 5(c). Here, the quantized data D1 to D6, include the part of data before and after the slice level in terms of time, as well as the data of waveform X.

Second, in step S12, the characteristic test device 1 computes the time point P1 at which the RF signals become a slice level, by interpolating from the quantized data D1 and D2. For example, provided that the quantized data at the level more than the slice level is plus, and the quantized data at the level less than the slice level is minus, there must exist the point at which the RF signals become a slice level, between the two(2) quantized data where signs are changed. Therefore, the characteristic test device 1 can compute the time point at which the RF signals become a slice level through interpolating, by using the level difference between the slice level of two(2) quantized data across the said slice level, and the time point which has been obtained by sampling the two(2) quantized data.

Third, in step S13, the characteristic test device 1 computes the time point P2 at which the RF signals become a slice level next to the time point P1, by interpolating from the quantized data D5 and D6, in the same procedures as the above step S12.

We would mention here that in the above step S12 and step S13, you can use any operation methods of interpolating the quantized data, in order to compute the time points P1 and P2 of the RF signals at the slice level: for example, you can computes them by linear interpolation. In addition, if you use the quantized data in the neighborhood of the slice level, you do not need to compute them from two(2) quantized data. Alternatively, for example, you may compute the time point at which the RF signals become a slice level from three(3) data or four(4) data.

Fourth, in step S14, the characteristic test device 1 computes the time breadth t1 between the computed time point P1, and the quantized data D2 which has been sampled immediately after the slice level.

Fifth, in step S15, the characteristic test device 1 computes the time breadth t2 between the computed time point P2, and the quantized data D5 which has been sampled immediately before the slice level.

Sixth, in step S16, the characteristic test device 1 computes the time breadth t3 between the quantized data D2 which has been sampled immediately after the slice level, and the quantized data D5 which has been sampled immediately before the slice level. The characteristic test device 1 can compute the said time breadth t3, based on the sampling number between the quantized data D2 and the quantized data D5, and the sampling frequency of the analog/digital converting circuit 6.

Seventh, in step S 17, the characteristic test device 1 adds the time breadth t1, the time breadth t2, and the time breadth t2, which were stated in the above, and computes the time breadth of waveform X.

As we have discussed in the above sections, the characteristic test device 1 can compute the cycle of waveform X, by processing the above step S1 to step S17, in step S7.

Furthermore, in step S7, the characteristic test device 1 measure time breadth of each waveform of the RF signals, that is, the time breadth of multiple waveform, as shown in FIG. 4(f). The characteristic test device 1 stores the data of the computed time breadth of each waveform in the data storage division 8b, for example.

Next, in step S8, the characteristic test device 1 divides the cycle of each waveform of the RF signals, which were computed in the above step S7, among the data for every cycle of each waveform, by using a cyclic window. Here, if the optical disc to be reproduced is a compact disc, "for every cycle of each waveform" means for every cycle of the waveform of the modulated signals, which have been included in the RF signals of the said compact disc, that is, every cycle of 3T to 11T. Cyclic window is a time domain in order to divide each waveform for every cycle. For example, if the cycle of each waveform of the RF signals, which were computed in the above step S7, exists in the time breadth at or more than 0T, less than 3.5T, as against the theoretical cycle T, then the characteristic test device 1 divides it into the classification of 3T; or if it exists in the time breadth at or more than 3.5T, less than 4.5T, as against the theoretical cycle T, then the characteristic test device 1 divides it into the classification of 4T.

As we have explained in the above, the characteristic test device 1 divides the cycle of each waveform, by using cyclic window. We would further mention that during performing such division, the characteristic test device 1 considers the reproducing speed of the optical disc.

Then in step S9, the characteristic test device 1 measures the jitter component a of the RF signals for every cycle, based on the time breadth divided for every cycle which was stated in the above.

For example, the said characteristic test device 1 totals the time breadth of the waveform of cycle 3T, which have been divided by cyclic window, then computes the average of them, and computes how much difference each data has from the said average. In addition, provided that the jitter component of each waveform is $\sigma_i$, the characteristic test device 1 computes the jitter component, which has been computed based on the reproduced signal of the waveform of all cycles, as shown in the following formula (1):

$$\sigma = \sqrt{(\Sigma n_i \sigma_i^2 / \Sigma n_i)} \qquad (1)$$

As we have discussed in the above sections, the characteristic test device 1 can measure the jitter of the optical pickup 2.

Furthermore, the processing division 8d adds the results of measuring the jitter component to the controlled variable of focus servo as offset component. Under the said condition, the characteristic test device 1 once again processes from step S1 to step S9, which were stated in the previous section. By going through such procedures, the characteristic test device 1 can perform feedback on the results of measuring the jitter component to the servo control circuit 5, and re-measure the jitter.

As we have explained in the above sections, the characteristic test device 1 is noise-resistant, and it can stably measure the jitter component, because the characteristic test device 1 computes the time breadth of each waveform of the reproduced signal of the optical disc, by using digital processing. In addition, the characteristic test device 1 can measure the jitter component, for every cycle included in the RF signals, for example, every 3T to 11T. Furthermore, the characteristic test device 1 can easily measure total of the jitter components, which are included in the reproduced signal of the waveform of all cycles.

The characteristic test device 1 has very simple circuit configuration. Even if you need to amend the measurement content, you only need to amend the processing programs and can save cost.

In addition, when you measures the jitter of the optical pickup 2 by using the system which adopts the multiple characteristic test devices 1, you can easily make correction among devices, and you will not generate the unevenness in the measurement results among each device.

Moreover, by going through the following processing procedures, the characteristic test device 1 can compute the amplitude of every waveform of the RF signals, as well as measure the jitter component:

The characteristic test device 1 has computed the time breadth of waveform X in the processing in step S7, as we have described in the previous sections. During the said procedure, the characteristic test device 1 computes the approximate formula of the waveform X, by using the quantized data D1 to D6. Based on the said approximate formula, the characteristic test device 1 computes the peak value of the waveform X. The characteristic test device 1 divides the said peak value among every cyclic window, which has been mentioned in step S8, and computes the average value of the peak value for every cycle. In such procedures, the characteristic test device 1 can compute the amplitude of every cycle of the RF signals.

Finally, the characteristic test device 1 can compute the asymmetry (unbalance) of the peak value of each cycle, by comparing the amplitude of every cycle one another, which has been computed through the above procedures.

We have explained the characteristic test device 1 to measure the characteristics of the optical pickup 2. However, it is possible to apply the characteristic test device 1 to the characteristic test device for optical disc. That is, the characteristic test device 1, which was described in the previous sections, uses an optical disc which is set in the test bench 3, as its reference; if you use optical pickup as its reference, you can measure the characteristics of the optical disc.

In addition, the optical pickup 2 which is to be measured by the characteristic test device 1, has measured the signal A to F, by using the photo detector shown in FIG. 2; however, adoption of this invention is not limited only to a such type of optical pickup. For example, it is possible to apply it to the optical pickup which is used in optical pickup used for optical magnetic disc or phase change disc. In such cases, since the configuration of the photo detector will be generally different from the one explained in FIG. 2, the circuit configurations of the matrix circuit 4 and the servo control circuit 5 will correspond to the optical pickup which will be measured. Also, in case of adopting to the optical magnetic disc, since the reproduced signal will be the difference signal which uses Kerr effect, we will adopt the program in which the contents of processing at the processing division 8d correspond to the said difference signal.

Furthermore, the optical pickup 2 which is to be measured by the characteristic test device 1, can be not the one in which the object lens is installed as one body, but so-called photo coupler, which has light-emitting device, prism, and light receiving element on a semi-conductor board. In such a case, the photo coupler can be freely attached to and removed from the characteristic test device 1, and the object lens is equipped with the device.

Moreover, the embodiment of the invention can be adopted to the recording and/or reproducing system of optical disc, which has the analog/digital converting circuit 6, the memory 7, and the computer 8, and performs feedback of the measurement result of the jitter component, then records and reproduces the signals under the optimized reproducing or recording conditions.

That means, such the recording and/or reproducing system of optical disc is equipped with not only the ordinary circuit configuration of optical disc, but also the analog/digital converting circuit to which the output from the reproduced signal of the optical pickup, is supplied, as well as the processing division which computes the characteristics of the reproduced signal, based on the output from the analog/digital converting circuit.

The said processing division, for example, consists of a digital signal processor. It measures the jitter component, which has been discussed in the previous sections, based on the above output data from the analog/digital converting circuit. The processing division, based on the said measurement result, controls the reproducing circuit so that the servo characteristic or the reproducing characteristic of the recording and/or reproducing system is optimized. Then, the recording and/or reproducing system of optical disc can reproduce the optical disc under the optimized reproducing condition.

The jitter measurement device for reproducing a signal of optical disc, regarding this embodiment of the invention, converts the reproduced signal of optical disc into digital data at a predetermined sampling frequency; interpolates the time point at which the reproduced signal equals or exceeds a predetermined slice level; and computes the jitter component of the reproduced signal.

By the above procedures, the said jitter measurement device for reproduced signal of optical disc is noise-resistant, and be able to measure the jitter component stably. In addition, the characteristic test device 1, regarding this embodiment of the invention, can measure the jitter component for every cycle which is included in the reproduced signal. Furthermore, the characteristic test device 1, regarding this embodiment of the invention, can measure the total of the jitter components, which are included in the reproduced signal of the waveform of all cycles.

The jitter measurement method for reproduced signal of optical disc, regarding this embodiment of the invention, converts the reproduced signal of optical disc into digital data at the indicated sampling frequency; interpolates the time point at which the reproduced signal becomes the indicated slice level; and computes the jitter component of the reproduced signal.

By the above procedures, the said jitter measurement device for reproduced signal of optical disc is noise-resistant, and be able to measure the jitter component stably. In addition, the characteristic test device i, regarding this embodiment of the invent ion, can measure the jitter component for every cycle which is included in the reproduced signal. Furthermore, the characteristic test device 1, regarding this embodiment of the invention, can measure the total of the jitter components, which are included in the reproduced signal of the waveform of all cycles.

The recording and/or reproducing system of optical disc, regarding this embodiment of the invention, converts the reproduced signal of optical disc into digital data at the indicated sampling frequency; interpolates the time point at which the reproduced signal becomes the indicated slice level; computes the jitter component of the reproduced signal; and feedback controls the reproduced signal, based on the said jitter component.

By the above procedures, the said recording and/or reproducing system of optical disc, regarding this embodiment of the invention, can reproduce the optical disc under the optimized reproducing condition.

The reproducing method of optical disc, regarding this embodiment of the invention, converts the reproduced signal of optical disc into digital data at the indicated sampling frequency; interpolates the time point at which the reproduced signal becomes the indicated slice level; computes the jitter component of the reproduced signal; and feedback controls the reproduced signal, based on the said jitter component.

By the above procedures, the said reproducing method of optical disc, regarding this embodiment of the invention, can reproduce the optical disc under the optimized reproducing condition.

In summary, embodiments of the invention supply the jitter measurement device for reproduced signal of optical disc; the jitter measurement method for reproduced signal of optical disc; the recording and/or reproducing system of optical disc; and the reproducing methods of optical disc.

In addition, embodiments of the invention supply the recording and/or reproducing system of optical disc, as well as reproducing methods of optical disc, which are able to optimize the jitter component.

The jitter measurement device for reproduced signal of optical disc, regarding embodiments of this invention, has the following features: the analog/digital conversion means converting the reproduced signal of optical disc, in which the digital data in accordance with the indicated modulation rule is stored, into digital data which samples at the indicated sampling frequency, and indicates signal levels at each sampling point; and the jitter operation means, based on the above signal levels and the above sampling frequency which is neighborhood of the indicated slice level, corrects and computes the time point at which the above reproduced signal reaches the above slice level, computes each time breadth between the time points at which the above reproduced signal reaches the above slice level, and computes the jitter component of the reproduced signal, based on the above each time breadth.

The said jitter measurement device for reproduced signal of optical disc, converts the reproduced signal of optical disc into digital data which samples at the indicated sampling frequency; corrects and computes the time point at which the above reproduced signal reaches the above slice level; and computes the jitter component of the reproduced signal.

The jitter measurement device for reproduced signal of optical disc, regarding an embodiment of this invention, has the following features: the jitter operation means computes the peak value of the reproduced signal from the signal level at the above each sampling point, then sets the indicated slice level stated in the above, based on the peak value. The said jitter measurement device for reproduced signal of optical disc, computes the peak value of the reproduced signal, and computes the jitter component of the reproduced signal.

The jitter measurement device for reproduced signal of optical disc, regarding an embodiment of this invention, has the following features: the jitter operation means extracts the time breadth to which the cycle of each waveform correspondents, which is included in the reproduced signal of optical disc, from the each time breadth between the time points at which the above reproduced signal reaches the above slice level, with using the indicated time breadth as its reference, and computes the jitter component of the reproduced signal.

The said jitter measurement device for reproduced signal of optical disc, extracts the time breadth to which the cycle of each waveform correspondents, and computes the jitter component of the reproduced signal.

The jitter measurement device for reproduced signal of optical disc, regarding an embodiment of this invention, has the following features: the jitter operation means computes the jitter component of the reproduced signal, as well as it extracts the time breadth to which the cycle of each waveform correspondents, which is included in the reproduced signal of optical disc, from the each time breadth between the time points at which the above reproduced signal reaches the above slice level, with using the indicated time breadth as its reference, and computes the amplitude of the reproduced signal with the waveform of each cycle.

The said jitter measurement device for reproduced signal of optical disc, computes the jitter component of the reproduced signal, as well as computes the amplitude of the reproduced signal with the waveform of each cycle. The jitter measurement device for reproduced signal of optical disc, regarding an embodiment of this invention, has the following features: the jitter operation means computes the jitter component of the reproduced signal, as well as it computes asymmetry of the amplitude of the reproduced signal of optical disc, with the waveform of each cycle.

The said jitter measurement device for reproduced signal of optical disc, computes the jitter component of the reproduced signal, as well as it computes asymmetry of the amplitude of the reproduced signal of optical disc, with the waveform of each cycle.

The jitter measurement method for reproduced signal of optical disc, regarding an embodiment of this invention, has the following features: it samples the reproduced signal of optical disc, in which the digital data in accordance with the indicated modulation rule is stored, at the indicated sampling frequency, and converts them into digital data which indicates the signal levels at each sampling point; based on the above signal levels and the above sampling frequency which is neighborhood of the indicated slice level, it corrects and computes the time point at which the above reproduced signal reaches the above slice level; it computes each time breadth between the time points at which the above reproduced signal reaches the above slice level; and it computes the jitter component of the reproduced signal, based on the above each time breadth.

In the said jitter measurement method for reproduced signal of optical disc, it converts them into digital data at the indicated sampling frequency, and corrects and computes the time point at which the above reproduced signal reaches the above slice level, then computes the jitter component of the reproduced signal.

The jitter measurement method for reproduced signal of optical disc, regarding an embodiment of this invention, has a feature as follows: it computes the peak value of the reproduced signal from the signal level at the above each sampling point, then sets the indicated slice level stated in the above, based on the peak value.

In the said jitter measurement method for reproduced signal of optical disc, it computes the peak value of the reproduced signal and computes the jitter component of the reproduced signal.

The jitter measurement method for reproduced signal of optical disc, regarding an embodiment of this invention, has a feature as follows: it extracts the time breadth to which the cycle of each waveform correspondents, which is included in the reproduced signal of optical disc, from the each time breadth between the time points at which the above reproduced signal reaches the above slice level, with using the indicated time breadth as its reference; and it computes the jitter component of the reproduced signal.

In the said jitter measurement method for reproduced signal of optical disc, it extracts the time breadth to which the cycle of each waveform correspondents, which is included in the reproduced signal, and computes the jitter component of the reproduced signal of optical disc.

The jitter measurement method for reproduced signal of optical disc, regarding an embodiment of this invention, has the following features: it computes the jitter component of the reproduced signal, as well as it extracts the time breadth to which the cycle of each waveform correspondents, which is included in the reproduced signal of optical disc, from the each time breadth between the time points at which the above reproduced signal reaches the above slice level, with using the indicated time breadth as its reference, and computes the amplitude of the reproduced signal with the waveform of each cycle.

In the said jitter measurement method for reproduced signal of optical disc, it computes the jitter component of the reproduced signal, as well as it extracts the time breadth of the waveform with each cycle.

The jitter measurement method for reproduced signal of optical disc, regarding an embodiment of this invention, has the following features: it computes the jitter component of the reproduced signal, as well as it computes asymmetry of the amplitude of the reproduced signal of optical disc with the waveform of each cycle.

In the said jitter measurement method for reproduced signal of optical disc, it computes the jitter component of the reproduced signal, as well as it computes asymmetry of the amplitude of the reproduced signal of the waveform of each cycle of the reproduced signal.

The recording and/or reproducing system of optical disc, regarding an embodiment of this invention, has the following features: the reproducing method which reproduces the optical disc, in which the digital data in accordance with the indicated modulation rule is stored, and outputs the data according to the recorded signals; the analog/digital conversion means which converts the reproduced signal, which the above reproducing method has reproduced, into the digital data which samples at the indicated sampling frequency and indicates signal levels at each sampling point; the jitter operation means, based on the above signal levels and the above sampling frequency which is neighborhood of the indicated slice level, corrects and computes the time point at which the above reproduced signal reaches the above slice level, and computes each time breadth between the time points at which the above reproduced signal reaches the above slice level, then computes the jitter component of the reproduced signal, based on the above each time breadth, finally, controls the above reproducing measures, based on the jitter component.

The said recording and/or reproducing system of optical disc, convert the reproduced signal of the optical disc into the digital data at the indicated sampling frequency, corrects and computes the time point at which the above reproduced signal reaches the above slice level, computes the jitter component of the reproduced signal, and perform feedback control on the reproducing measures, based on the said jitter component.

The reproducing method of optical disc, regarding an embodiment of this invention, has the following features: it reproduces the optical disc, in which the digital data in accordance with the above indicated modulation rule is stored, and outputs the data according to the said recorded signals; it converts the reproduced signal, in which the digital data in accordance with the above indicated modulation rule is stored, into the digital data which samples at the indicated sampling frequency and indicates signal levels at each sampling point; based on the above signal levels and the above sampling frequency which is neighborhood of the indicated slice level, it corrects and computes the time point at which the above reproduced signal reaches the above slice level; it computes each time breadth between the time points at which the above reproduced signal reaches the above slice level; it computes the jitter component of the reproduced signal, based on the above each time breadth; and it controls the above reproducing measures, based on the jitter component.

In the reproducing method of optical disc, it converts the reproduced signal of the optical disc into digital data at the indicated sampling frequency, corrects and computes the time point at which the above reproduced signal reaches the slice level, computes the jitter component of the reproduced signal, and performs feedback control on the reproducing measures, based on said jitter component.

The measuring device for characteristic of optical pickup (hereinafter referred to as "characteristic test device") inspects the characteristic of optical pickup, which is used for optical disc drive. Such characteristic test device is adopted in the specification test of optical pickup or research on the characteristic of optical pickup: for example, it is adopted in shipping test or acceptance test of optical pickup.

The foregoing description of the preferred embodiments of the invention has been presented for purposes of illustration and description and is not intended to be exhaustive or limit the invention to the precise form disclosed herein. In view of the above teachings, obvious modifications or variations will be apparent to those skill in the art. All such modifications and variations are fully contemplated by the inventor and are within the scope of the invention as determined by the appended claims when interpreted in accordance with the breadth to which they are fairly, legally and equitably entitled.

What is claimed is:

1. A method of measuring jitter in pulse width modulated signals previously recorded on an optical disk in units of cycles and being reproduced therefrom, comprising the steps of:
    detecting a cyclic signal reproduced from said optical disk using an optical pickup;
    sampling said cyclic signal at a predetermined sampling interval so as to define sampling points, thereby producing sample data corresponding to the signal level of the cyclic signal at each of the sampling points;
    computing a timebreadth corresponding to a time interval for which the signal level exceeds a slice level; said timebreadth being computed by:
        computing a first time point at which the signal level first exceeds said slice level, by interpolating between the sampling point first exceeding said slice level and the previous sampling point;
        computing a second time point at which the signal level first drops below said slice level subsequent to said first time point, by interpolating between the sampling point last exceeding said slice level and the next sampling point;
        computing a first time interval corresponding to the time between said first time point and the sampling point first exceeding said slice level;
        computing a second time interval corresponding to the time between the sampling point first exceeding said slice level and the sampling point last exceeding said slice level;
        computing a third time interval corresponding to the time between said second time point and the sampling point last exceeding said slice level; and
        computing said timebreadth by adding the first, second, and third time intervals; and
    calculating a jitter measurement based upon the difference between the computed timebreadth and a cyclic window corresponding to a theoretical timebreadth of the cyclic signal as recorded.

2. The method according to claim 1, further comprising the steps of:
    detecting a peak level of the sampled cyclic signal; and
    computing said slice level based upon said peak level.

3. The method according to claim 2, wherein said peak level is based upon a maximum level and the absolute value of a minimum level of the sampled cyclic signal.

4. The method according to claim 3, wherein said peak level must exceed one fourth of the value of a theoretical signal level for said cyclic signal.

5. The method according to claim 3, wherein said peak level must be sustained for a time interval greater than one half a minimum cyclic window corresponding to a minimum theoretical timebreadth of the cyclic signal as recorded.

6. The method according to claim 1, further comprising the step of computing an asymmetry value for the reproduced cyclic signal by detecting and comparing a peak value for each cycle of the cyclic signal.

7. A device for measuring jitter in pulse width modulated signals previously recorded on an optical disk in units of cycles and being reproduced therefrom, comprising:
    an optical pickup for detecting a cyclic signal reproduced from said optical disk;
    an analog-to-digital converter for sampling said cyclic signal at a predetermined sampling interval so as to define sampling points, thereby producing sample data corresponding to the signal level of the cyclic signal at each of the sampling points;
    an operation processing means for computing a timebreadth corresponding to a time interval for which the signal level exceeds a slice level; said timebreadth being computed by:
        computing a first time point at which the signal level first exceeds said slice level, by interpolating between the sampling point first exceeding said slice level and the previous sampling point;
        computing a second time point at which the signal level first drops below said slice level subsequent to said first time point, by interpolating between the sampling point last exceeding said slice level and the next sampling point;
        computing a first time interval corresponding to the time between said first time point and the sampling point first exceeding said slice level;
        computing a second time interval corresponding to the time between the sampling point first exceeding said slice level and the sampling point last exceeding said slice level;
        computing a third time interval corresponding to the time between said second time point and the sampling point last exceeding said slice level; and
        computing said timebreadth by adding the first, second, and third time intervals; and
    said operation processing means further calculating a jitter measurement based upon the difference between the computed timebreadth and a cyclic window corresponding to a theoretical timebreadth of the cyclic signal as recorded.

8. The device according to claim 7, wherein said operation processing means further detects a peak level of the sampled cyclic signal and computes said slice level based upon said peak level.

9. The device according to claim 8, wherein said peak level is based upon a maximum level and the absolute value of a minimum level of the sampled cyclic signal.

10. The device according to claim 9, wherein said peak level must exceed one fourth of the value of a theoretical signal level for said cyclic signal.

11. The device according to claim 9, wherein said peak level must be sustained for a time interval greater than one half a minimum cyclic window corresponding to a minimum theoretical timebreadth of the cyclic signal as recorded.

12. The device according to claim 7, wherein said operation processing means further computes an asymmetry value for the reproduced cyclic signal by detecting and comparing a peak value for each cycle of the cyclic signal.

* * * * *